US008007990B2

(12) United States Patent
Patil et al.

(10) Patent No.: US 8,007,990 B2

(45) Date of Patent: Aug. 30, 2011

(54) THICK FILM LAYERS AND METHODS RELATING THERETO

(75) Inventors: Girish S. Patil, Lexington, KY (US); Sean T. Weaver, Union, KY (US); Rich Wells, Westerville, OH (US)

(73) Assignee: Lexmark International, Inc., Lexington, KY (US)

(*) Notice: Subject to any disclaimer, the term of this patent is extended or adjusted under 35 U.S.C. 154(b) by 88 days.

(21) Appl. No.: 12/496,786

(22) Filed: Jul. 2, 2009

(65) Prior Publication Data

US 2009/0269707 A1 Oct. 29, 2009

Related U.S. Application Data

(62) Division of application No. 11/361,731, filed on Feb. 24, 2006, now Pat. No. 7,571,979.

(60) Provisional application No. 60/722,767, filed on Sep. 30, 2005.

(51) Int. Cl.
*G03F 7/26* (2006.01)

(52) U.S. Cl. ......................... 430/322; 430/320; 430/330

(58) Field of Classification Search .................. 430/311, 430/322, 320

See application file for complete search history.

(56) References Cited

U.S. PATENT DOCUMENTS

| | | | |
|---|---|---|---|
| 4,026,705 | A | 5/1977 | Crivello et al. |
| 4,401,537 | A | 8/1983 | Chern et al. |
| 4,426,431 | A | 1/1984 | Harasta et al. |
| 4,666,823 | A | 5/1987 | Yokota et al. |
| 4,943,516 | A | 7/1990 | Kamayachi et al. |
| 5,229,251 | A | 7/1993 | Babich et al. |
| 5,335,004 | A | 8/1994 | Matsuhisa |
| 5,530,036 | A | 6/1996 | Sano et al. |
| 5,656,336 | A | 8/1997 | Kamen et al. |
| 5,730,889 | A | 3/1998 | Miyagawa et al. |
| 5,882,792 | A | 3/1999 | Moireau |
| 5,907,333 | A | 5/1999 | Patil et al. |
| 5,986,035 | A | 11/1999 | Inagaki et al. |
| 6,025,406 | A | 2/2000 | Oxman et al. |
| 6,187,833 | B1 | 2/2001 | Oxman et al. |
| 6,193,359 | B1 | 2/2001 | Patil et al. |
| 6,260,949 | B1 | 7/2001 | Smith et al. |
| 6,358,354 | B1 | 3/2002 | Patil |
| 6,391,523 | B1 | 5/2002 | Hurditch et al. |
| 6,399,277 | B1 | 6/2002 | Nojima et al. |
| 6,425,655 | B1 | 6/2002 | Patil |
| 6,427,325 | B1 | 8/2002 | Johansson et al. |
| 6,440,643 | B1 | 8/2002 | Calistri-Yeh et al. |
| 6,692,793 | B2 | 2/2004 | Sato et al. |
| 6,716,568 | B1 | 4/2004 | Minsek et al. |
| 6,783,918 | B2 | 8/2004 | Patil et al. |
| 6,830,646 | B2 | 12/2004 | Patil et al. |
| 2002/0132872 | A1 | 9/2002 | Yamamura et al. |
| 2004/0109048 | A1 | 6/2004 | Fukunaga et al. |
| 2004/0142272 | A1 | 7/2004 | Song et al. |
| 2005/0095530 | A1 | 5/2005 | Hosaka et al. |

FOREIGN PATENT DOCUMENTS

| | | |
|---|---|---|
| EP | 0488705 A1 | 6/1992 |
| GB | 2177093 A | 1/1987 |

*Primary Examiner* — Kathleen Duda

(57) ABSTRACT

Thick film layers for a micro-fluid ejection head, micro-fluid ejection heads, and methods for making micro-fluid ejection head and thick film layers. One such thick film layer is derived from a difunctional epoxy component having a weight average molecular weight ranging from about 2500 to about 4000 Daltons, a photoacid generator, an aryl ketone solvent, and an adhesion enhancing component. One such thick film layer has a cross-link density upon curing that increases the dimensional stability of the thick film layer sufficient to provide flow features therein having substantially vertical walls.

5 Claims, 6 Drawing Sheets

THICK FILM LAYERS AND METHODS RELATING THERETO

CROSS REFERENCE TO RELATED APPLICATIONS

This is a divisional application of U.S. patent application Ser. No. 11/361,731 filed Feb. 24, 2006 now U.S. Pat. No. 7,571,979, entitled "THICK FILM LAYERS AND METHODS RELATING THERETO", which claims the benefit of U.S. Provisional Application Ser. No. 60/722,267, filed on Sep. 30, 2005.

FIELD OF THE INVENTION

The invention relates to, for example, improved radiation curable resin formulations and to methods for attaching a nozzle member to a substrate for a micro-fluid ejection head having a thick film layer derived from the improved radiation curable resin formulation.

BACKGROUND AND SUMMARY

Micro-fluid ejection devices, such as ink jet printers continue to evolve as the technology for ink jet printing continues to improve to provide higher speed, higher quality printers. However, the improvement in speed and quality does not come without a price. The micro-fluid ejection heads are more costly to manufacture because of tighter alignment tolerances.

For example, micro-fluid ejection heads were made with nozzle members, such as nozzle plates, containing flow features. The nozzle plates were then aligned, and adhesively attached to a substrate. However, minor imperfections in the substrate or nozzle plate components of the ejection head or improper alignment of the parts may have a significant impact on the performance of the ejection heads. For the purposes of this disclosure, the term "substrate" is intended to include, but is not limited to, semiconductor substrates, silicon substrates, and/or ceramic substrates suitable for use in providing micro-fluid ejection heads.

One advance in providing improved micro-fluid ejection heads is the use of a photoresist layer applied to a device surface of the substrate as a thick film layer. The thick film layer is imaged to provide flow features for the micro-fluid ejection heads. Use of the imaged thick film layer enables more accurate alignment between the flow features and ejection actuators on the device surface of the substrate.

While the use of an imaged photoresist layer improves alignment of the flow features to the ejection actuators, there may still exist alignment problems associated with the nozzle plate. Misalignment between the ejection actuators and corresponding nozzle (e.g., holes) in a nozzle plate attached to the thick film layer has a disadvantageous effect on the accuracy of fluid droplets ejected from the nozzles. Ejector actuator and nozzle hole alignment also has an effect on the mass and velocity of the fluid droplets ejected through the nozzles.

Conventional photoresist layers used for the thick film layer are derived from components that affect the properties and characteristics of the thick film layer once the layer is imaged and developed. For example, conventional photoresist layers are subject to developing stress cracks, imperfections, and distortions that reduce adhesion between the thick film layer and the nozzle plate attached to the thick film layer. Accordingly, there is a need for, for example, improved photoresist or photoimageable materials that provide enhanced characteristics and dimensional stability for use in micro-fluid ejection head structures.

Amongst other embodiments of the present invention, there is provided a thick film layer for a micro-fluid ejection head, a micro-fluid ejection head, and a method for making a micro-fluid ejection head. One such thick film layer includes a negative photoresist layer derived from a composition containing a multi-functional epoxy compound, a difunctional epoxy compound, a photoacid generator devoid of aryl sulfonium salts, an adhesion enhancer, and an aryl ketone solvent. The negative photoresist layer has increased planarity subsequent to photoimaging and developing the photoresist layer.

In another embodiment there is provided a method for increasing the planarity of a surface of a thick film layer after photoimaging and developing flow features therein for a micro-fluid ejection head. The method includes applying a negative photoresist layer adjacent (e.g., to) a device surface of a substrate. The negative photoresist layer is derived from a multi-functional epoxy compound, a difunctional epoxy compound, a photoacid generator devoid of aryl sulfonium salts, an adhesion enhancer, and an aryl ketone solvent. The photoresist layer is imaged and developed to provide the flow features therein, wherein the thick film layer has a substantially planar thick film layer surface.

In yet another embodiment, there is provided a micro-fluid ejection head including a substrate having a device surface. The ejection head has a photoimaged and developed thick film layer applied adjacent the device surface of the substrate. The thick film layer is a negative photoresist layer derived from a multi-functional epoxy compound, a difunctional epoxy compound, a photoacid generator devoid of aryl sulfonium salts, an adhesion enhancer, and an aryl ketone solvent. Upon imaging and developing, the negative photoresist layer has increased planarity for use in the micro-fluid ejection head. A nozzle member is adjacent the imaged and developed thick film layer.

A further embodiment of the disclosure provides a dimensionally stable thick film layer for a micro-fluid ejection head. The dimensionally stable thick film layer is derived from a difunctional epoxy component having a weight average molecular weight ranging from about 2500 to about 4000 Daltons, a photoacid generator, an aryl ketone solvent, and an adhesion enhancing component. The dimensionally stable thick film layer has a cross-link density upon curing that increases the dimensional stability of the thick film layer sufficient to provide flow features therein having substantially vertical walls.

An advantage of the compositions and methods according to at least some of the exemplary embodiments of the disclosure is that the thick film layer may be made and processed with fewer imperfections. For example, stress cracking of the thick film layer may be reduced. Also, planarity of the thick film layer and resistance to various fluids may also significantly improved over conventional thick film layers. The improved planarity of the thick film layer is effective to provide improved adhesion between the nozzle member and the thick film layer thereby reducing the incidence of delamination that may occur.

Additionally, thick film layers made according to at least some of the exemplary embodiments of the disclosure may exhibit significantly increased dimensional stability during subsequent micro-fluid ejection head manufacturing steps. An increase in dimensional stability of the thick film layer may be achieved by increasing the cross-link density of the thick film layer to a predetermined level. The dimensional stability of the thick film layer may be determined, for example, by observing the amount of deformation of flow features formed in the thick film layer during a step of bonding a nozzle member to the thick film layer. Excessive shrinkage of the thick film layer, which may reduce adhesion of the thick film layer to a substrate, may result if the cross-link density is too high. Accordingly, the compositions described herein may provide suitable thick film layers that provide the desirable stability and adhesion characteristics required for micro-fluid ejection heads.

For purposes of the disclosure, "difunctional epoxy" means epoxy compounds and materials having only two epoxy functional groups in the molecule. "Multifunctional epoxy" means epoxy compounds and materials having more than two epoxy functional groups in the molecule.

BRIEF DESCRIPTION OF THE DRAWINGS

Further advantages of the exemplary embodiments will become apparent by reference to the detailed description when considered in conjunction with the figures, which are not to scale, wherein like reference numbers indicate like elements through the several views, and wherein.

DETAILED DESCRIPTION OF EXEMPLARY EMBODIMENTS

Figure 1:
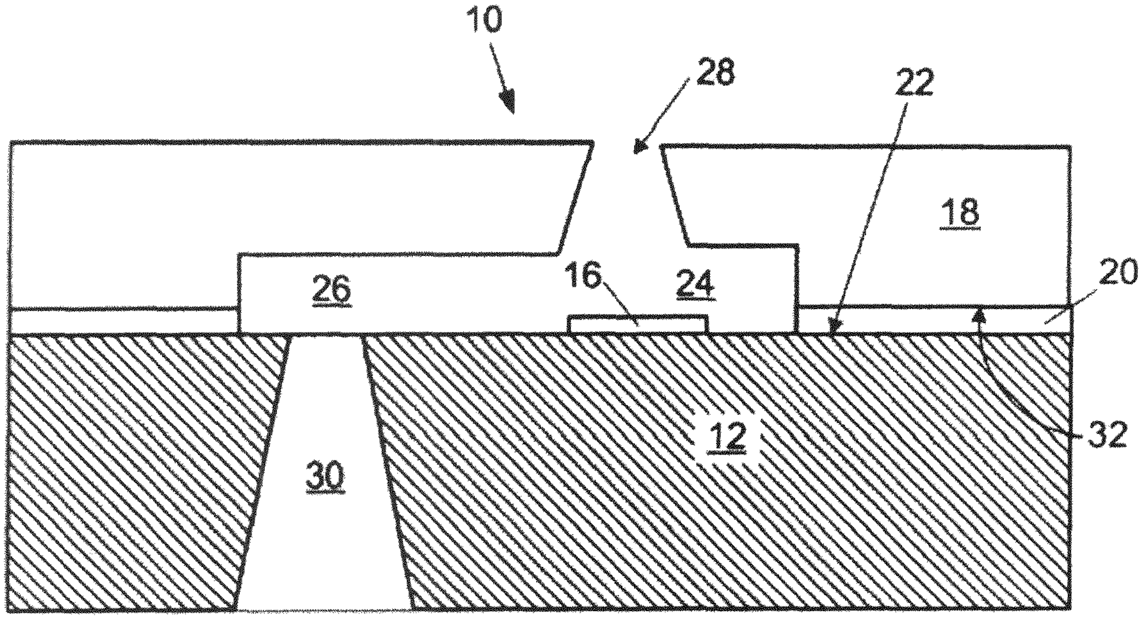
FIG. 1 Prior Art
FIG. 1 is a cross-sectional view, not to scale, of a portion of a prior art micro-fluid ejection head.

With reference to FIG. 1, there is shown, in partial cross-sectional view, a portion of a prior art micro-fluid ejection head 10. The micro-fluid ejection head 10 includes a substrate 12 having various insulative, conductive, resistive, and passivating layers providing a fluid ejector actuator 16.

In a prior art micro-fluid ejection head 10, a nozzle plate 18 is attached as by an adhesive 20 to a device surface 22 of the substrate 12. In such a micro-fluid ejection head 10, the nozzle plate 18 is made out of a laser ablated material, such as polyimide. The polyimide material is laser ablated to provide a fluid chamber 24 in fluid flow communication with a fluid supply channel 26. Upon activation of the ejector actuator, fluid is expelled through a nozzle hole 28 that is also laser ablated in the polyimide material of the nozzle plate 18. The fluid chamber 24 and fluid supply channel 26 are collectively referred to as "flow features." A fluid feed slot 30 is etched in the substrate 12 to provide fluid via the fluid supply channel 26 to the fluid chamber 24.

In order to provide the laser ablated nozzle plate 18, the polyimide material is laser ablated from a flow feature side 32 thereof before the nozzle plate 18 is attached to the substrate 12. Accordingly, misalignment between the flow features in the nozzle plate 18 and the fluid ejector actuator 16 may be detrimental to the functioning of the micro-fluid ejection head 10.

Figure 2:
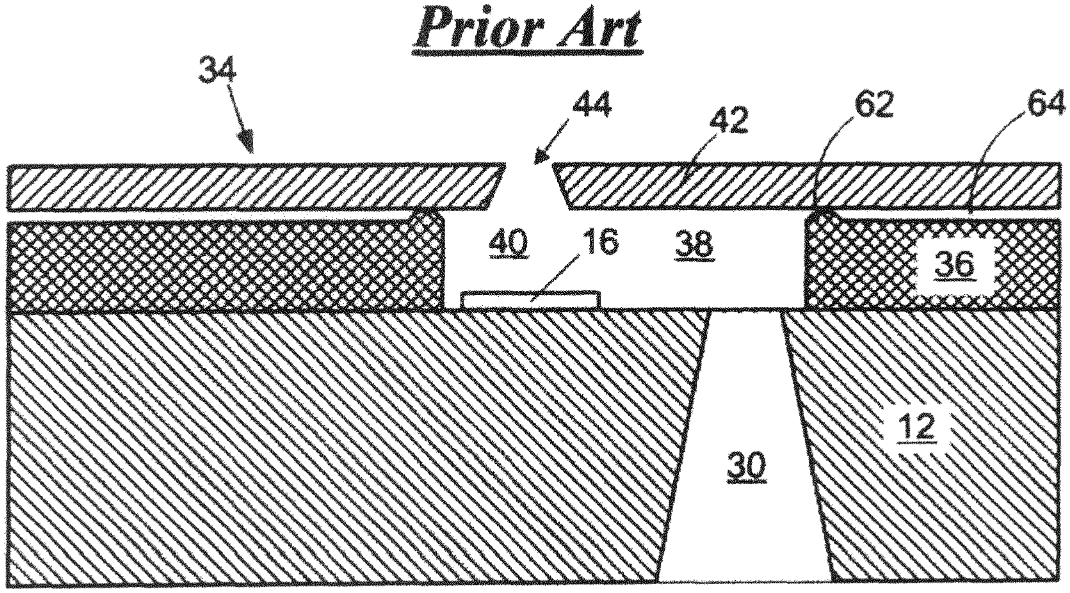
FIG. 2 Prior Art
FIG. 2 is a cross-sectional view, not to scale, of a portion of another micro-fluid ejection head containing a prior art thick film layer.

Another prior art micro-fluid ejection head 34 is illustrated in FIG. 2. In this prior art micro-fluid ejection head 34, a thick film layer 36 provides the flow features, i.e., a fluid supply channel 38 and a fluid chamber 40 for providing fluid to the fluid ejector actuator 16. In such an ejection head 34, the thick film layer 36 is a photoresist material that is spin coated onto the device surface 22 of the substrate 12. The photoresist material is then imaged and developed using conventional photoimaging techniques to provide the flow features. A separate nozzle plate 42 containing only nozzles, such as nozzle 44 is then attached to the thick film layer 36 as by thermal compression bonding or by use of an adhesive. As in FIG. 1, the nozzle plate 42 may be made of a laser ablated polyimide material.

Figure 3:
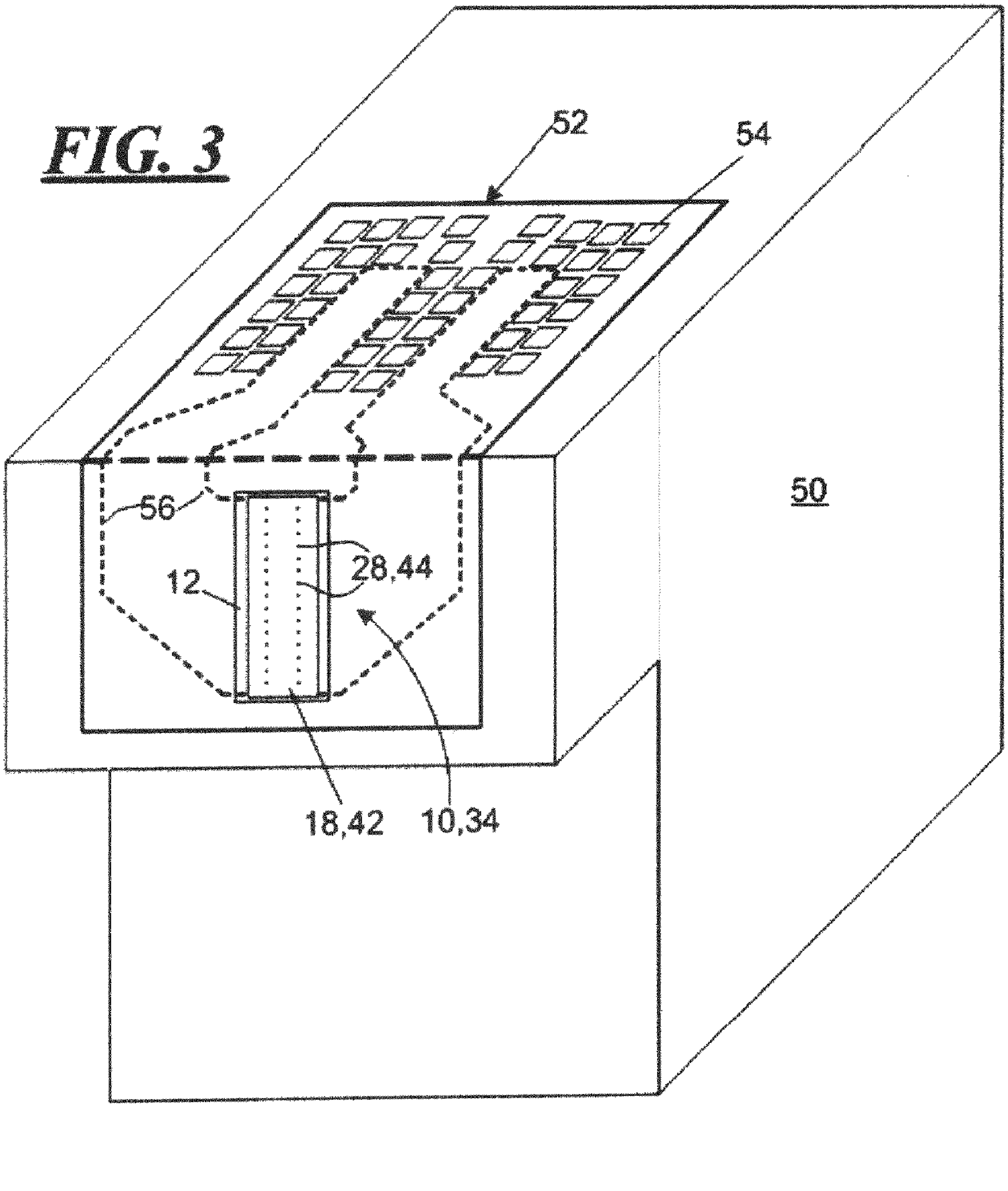
FIG. 3 is a perspective view, not to scale, of a fluid cartridge containing a micro-fluid ejection head.
Figure 4:
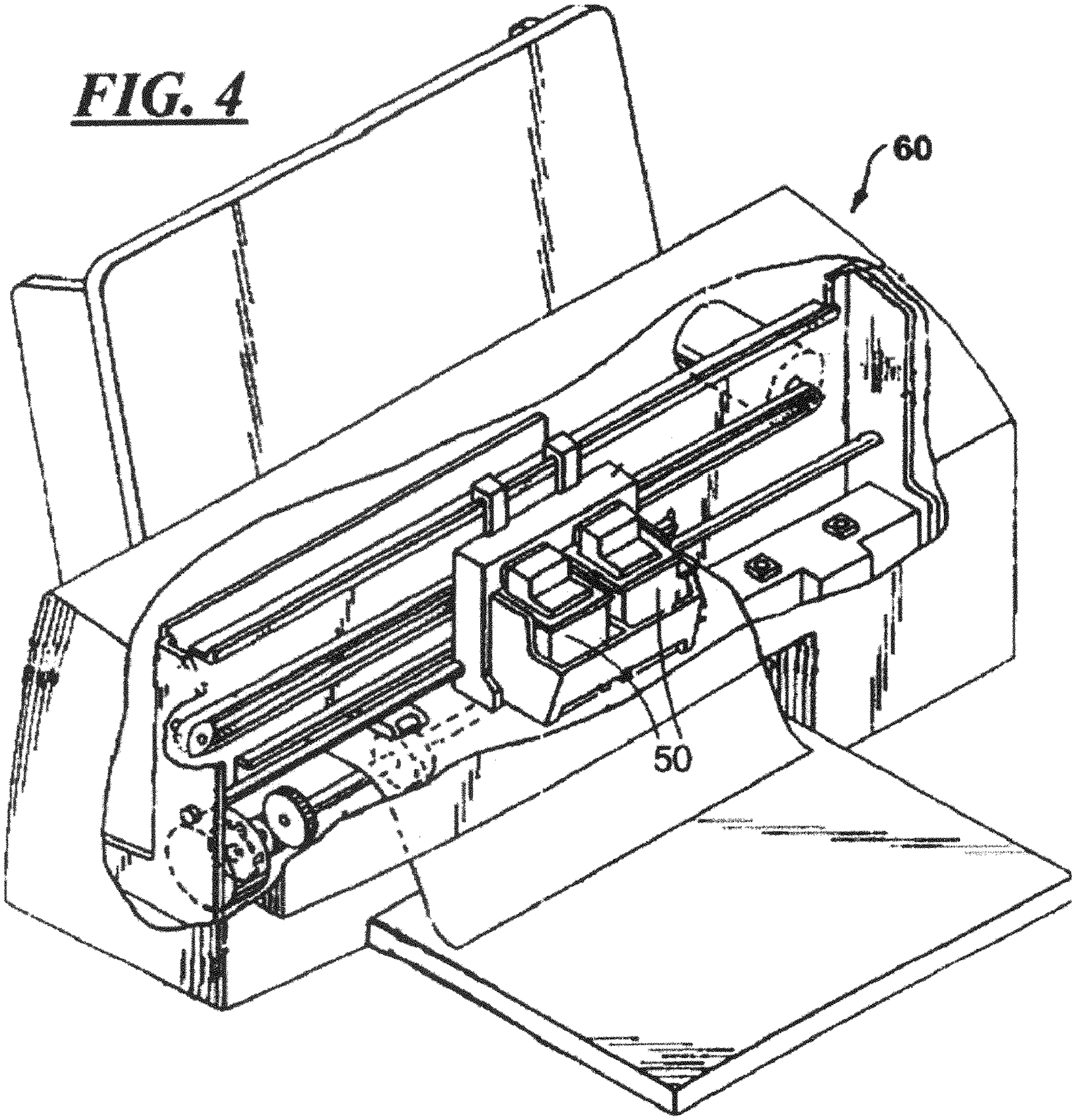
FIG. 4 is a perspective view, not to scale, of a micro-fluid ejection device.

The microfluid ejection head 10 or 34 may be attached to a fluid supply reservoir 50 as illustrated in FIG. 3. The fluid reservoir 50 includes a flexible circuit 52 containing electrical contacts 54 thereon for providing control and actuation of the fluid ejector actuators 16 on the substrate 12 via conductive traces 56. One or more reservoirs 50 containing the ejection heads 10 or 34 may be used in a micro-fluid ejection device 60, such as an ink jet printer as shown in FIG. 4 to provide control and ejection of fluid from the ejection heads 10 or 34.

Referring again to FIG. 2, while the thick film layer 36 enables more accurate alignment of the flow features with the ejector actuator 16, conventional photoresist materials for providing the thick film layer 36 may develop cracks and/or imperfections such as non-planar areas 62 (FIG. 2) which may create gaps 64 or otherwise reduce adhesion between the nozzle plate 42 and the thick film layer 36. Such reduced adhesion may lead to delamination of the nozzle plate 42 from the thick film layer. Additionally, the gaps 64 caused by the raised areas 62 may cause misalignment or distortion of the nozzle holes 44 thereby resulting in poor performance of the ejection head 34.

Figure 5:
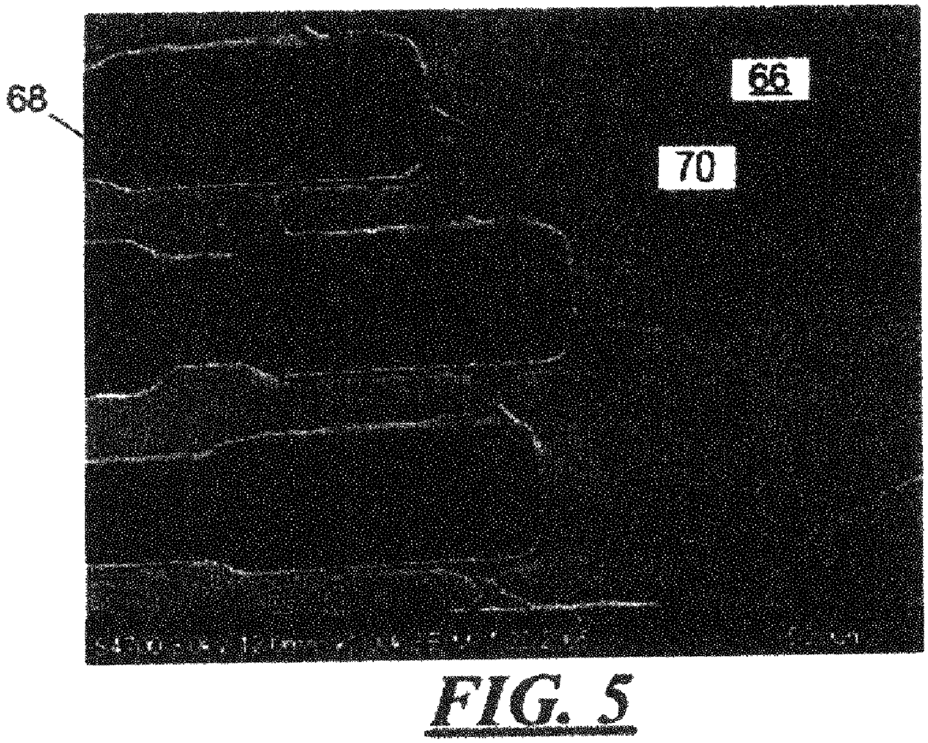
FIG. 5 is a photomicrograph of a thick film layer made with a formulation according to one embodiment after imaging and developing.

FIG. 5 is a photomicrograph of a portion of a thick film layer 66 made with a photoresist formulation according to one embodiment of the invention. Upon imaging and developing the thick film layer 66 to provide the flow features 68, imperfections 70 develop in the thick film layer 66. By comparison, a thick film layer 72 made according to another embodiment of the disclosure is much improved in planarity and has much more well-defined flow features 74 without the imperfections 70 of the previous photoresist material.

A photoresist formulation that provides the thick film layer 66 according to one embodiment of the disclosure includes a difunctional epoxy component, a photoacid generator, a non-reactive solvent, and, optionally, an adhesion enhancing agent. In another embodiment of the disclosure, a photoresist formulation that provides the improved thick film layer 72 further includes a multi-functional epoxy compound.

In the photoresist formulations according to the first and second embodiments of the disclosure, the difunctional epoxy component may be selected from difunctional epoxy compounds which include diglycidyl ethers of bisphenol-A (e.g. those available under the trade designations "EPON 1007F", "EPON 1007" and "EPON 1009F", available from Shell Chemical Company of Houston, Tex., "DER-331", "DER-332", and "DER-334", available from Dow Chemical Company of Midland, Mich., 3,4-epoxycyclohexylmethyl-3, 4-epoxycyclo-hexene carboxylate (e.g. "ERL-4221" available from Union Carbide Corporation of Danbury, Conn., 3,4-epoxy-6-methylcyclohexylmethyl-3,4-epoxy-6-methylcy-clohexene carboxylate (e.g. "ERL-4201" available from Union Carbide Corporation), bis(3,4-epoxy-6-methylcyclohexylmethyl) adipate (e.g. "ERL-4289" available from Union Carbide Corporation), and bis(2,3-epoxycyclopentyl)ether (e.g. "ERL-0400" available from Union Carbide Corporation.

An exemplary difunctional epoxy component is a bisphenol-A/epichlorohydrin epoxy resin available from Shell Chemical Company of Houston, Tex. under the trade name EPON resin 1007F having an epoxide equivalent of greater than about 1000. An "epoxide equivalent" is the number of grams of resin containing 1 gram-equivalent of epoxide. The weight average molecular weight of the difunctional epoxy component is typically above 2500, e.g., from about 2800 to about 3500 weight average molecular weight in Daltons. The amount of difunctional epoxy component in the photoresist formulation may range from about 30 to about 95 percent by weight based on the weight of the cured resin.

The photoresist formulation according to embodiments of the disclosure also includes a photoacid generator. The photoacid generator may be selected from a compound or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides. The photoacid generator may be present in the photoresist formulation in an amount ranging from about 0.5 to about 15 weight percent based on the weight of the cured resin.

Examples of triaryl-substituted sulfonium complex salt photoinitiators which may be used in the formulations according to the first embodiment include, but are not limited to:

triphenylsulfonium tetrafluoroborate
triphenylsulfonium hexafluorophosphate
triphenylsulfonium hexafluoroantimonate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluoroantimonate
4-acetoxy-phenyldiphenylsulfonium tetrafluoroborate
4-acetamidophenyldiphenylsulfonium tetrafluoroborate Of the triaryl-substituted sulfonium complex salts which are suitable for use in the formulations of the first embodiment, an exemplary salt may be a mixture of triarylsulfonium hexafluoroantimonate salt, commercially available from Union Carbide Corporation under the trade name CYRACURE UVI-6974.

Of the aromatic complex salts which may be suitable for use in an exemplary photoresist formulation according to the second embodiment of the disclosure, suitable salts may include di- and triaryl-substituted iodonium salts which are substantially devoid of aryl sulfonium salts. Examples of aryl-substituted iodonium complex salt photoacid generates include, but are not limited to:

diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)-phenyliodonium p-toluenesulfonate,
bis(4-tert-butylphenyl)iodonium hexafluorophosphate, and
diphenyliodonium hexafluoroantimonate.

An exemplary iodonium salt for use as a photoacid generator for the formulations of the second embodiment described herein is a mixture of diaryliodonium hexafluoroantimonate salts, commercially available from the Polyset, Company of Mechanicsville, N.Y. under the trade name PC-2506.

As previously noted, in the second embodiment of the disclosure, the photoresist formulation also contains a multifunctional epoxy component. A suitable multifunctional epoxy component may be selected from aromatic epoxides such as glycidyl ethers of polyphenols. An exemplary multifunctional epoxy resin is a polyglycidyl ether of a phenol-formaldehyde novolac resin such as a novolac epoxy resin having an epoxide gram equivalent weight ranging from about 190 to about 250 and a viscosity at 130° C. ranging from about 10 to about 60 poise, which is available from Resolution Performance Products of Houston, Tex. under the trade name EPON RESN SU-8.

The multi-functional epoxy component of the photoresist formulation according to such an embodiment may have a weight average molecular weight of about 3,000 to about 5,000 as determined by gel permeation chromatography, and an average epoxide group functionality of greater than 3, such as from about 6 to about 10. In an exemplary embodiment, the amount of multifunctional epoxy resin in the photoresist formulation according to the second embodiment ranges from about 30 to about 50 percent by weight based on the weight of the cured thick film layer 80.

The photoresist formulations may optionally include an effective amount of an adhesion enhancing agent such as a silane compound. Silane compounds that are compatible with the components of the photoresist formulation typically have a functional group capable of reacting with at least one member selected from the group consisting of the multifunctional epoxy compound (in embodiments wherein the same is included in the photoresist formulation), the difunctional epoxy compound and the photoinitiator. Such an adhesion enhancing agent may be a silane with an epoxide functional group such as a glycidoxyalkyltrialkoxysilane, e.g., gamma-glycidoxypropyltrimethoxysilane. When used, in an exemplary embodiment, the adhesion enhancing agent is present in an amount ranging from about 0.5 to about 5 weight percent, such as from about 0.9 to about 4.5 weight percent based on total weight of the cured resin, including all ranges subsumed therein (including, e.g., an exemplary range of from about 1.0 to about 1.5). Adhesion enhancing agents, as used herein, are defined to include organic materials soluble in the photoresist composition which assist the film forming and adhesion characteristics of the thick film layer 80 adjacent the device surface 22 of the substrate 12.

In order to provide the thick film layer 80 adjacent the device surface 22 of the substrate 12 (FIG. 7), a suitable solvent is used. An exemplary solvent is a solvent which is non-photoreactive. Non-photoreactive solvents include, but are not limited to, gamma-butyrolactone, $C_{1-6}$ acetates, tetrahydrofuran, low molecular weight ketones, mixtures thereof and the like. An exemplary non-photoreactive solvent is acetophenone. The non-photoreactive solvent is present in the formulation mixtures used to provide the thick film layer 80 in an amount ranging of from about 20 to about 90 weight percent, such as from about 40 to about 60 weight percent, based on the total weight of the photoresist formulation. In an exemplary embodiment, the non-photoreactive solvent does not remain in the cured thick film layer 80 and is thus is removed prior to or during the thick film layer 80 curing steps.

According to an exemplary procedure, a non-photoreactive solvent and a difunctional epoxy compound are mixed together in a suitable container, such as an amber bottle or flask and the mixture is put in a roller mill overnight at about 60° C. to assure suitable mixing of the components. After mixing the solvent and difunctional epoxy compound, the multifunctional epoxy compound, if used, is added to the container and the resulting mixture is rolled for two hours on a roller mill at about 60° C. The other components, such as the photoacid generator and/or the adhesion enhancing agent, are also added one at a time to the container and the container is rolled for about two hours at about 60° C. after adding all of the components to the container to provide a wafer coating mixture.

The photoresist formulations and resulting thick film layer 80 described herein are substantially devoid of acrylate or methacylate polymers and nitrile groups. Without desiring to be bound by theory, it is believed that the higher molecular weight difunctional epoxy material contributes sufficient thermoplastic properties to the thick film layer 36 to enable use of a photocurrable formulation that is substantially devoid of acrylate or methacrylate polymers and nitrile rubber components. Additionally, a photoresist formulation, substantially devoid of acrylate or methacrylate polymers, may have an increased shelf life as compared to the same photoresist formulation containing acrylate or methacrylate polymers.

A method for making the improved photoimaged thick film layer 80 will now be described with reference to FIGS. 7-9. In order to apply the photoresist formulation described above adjacent (e.g., to) the device surface 22 of the substrate (FIG. 7), such as a silicon substrate, a silicon substrate wafer is centered on an appropriate sized chuck of either a resist spinner or conventional wafer resist deposition track. The photoresist formulation mixture is either dispensed by hand or mechanically into the center of the wafer. The chuck holding the wafer is then rotated at a predetermined number of revolutions per minute to evenly spread the mixture from the center of the wafer to the edge of the wafer. The rotational speed of the wafer may be adjusted or the viscosity of the coating mixture may be altered to vary the resulting resin film thickness. Rotational speeds of 2500 rpm or more may be used. The amount of photoresist formulation applied to device surface 22 should be sufficient to provide the thick film layer 80 having the desired thickness for flow features imaged therein. Accordingly, the thickness of layer 80 after curing may range from about 10 to about 25 microns or more.

The resulting substrate wafer containing the thick film layer 80 is then removed from the chuck either manually or mechanically and placed on either a temperature controlled hotplate or in a temperature controlled oven at a temperature of about 90° C. for about 30 seconds to about 1 minute until the material is "soft" baked. This step removes at least a portion of the solvent from the thick film layer 80 resulting in a partially dried film adjacent the device surface 22 of the substrate 12. The wafer is removed from the heat source and allowed to cool to room temperature.

Prior to imaging and developing the thick film layer 80, the fluid feed slot 30 is formed in the substrate, such as by an etching process. An exemplary etching process is a dry etch process such as deep reactive ion etching or inductively coupled plasma etching. During the etching process, the photoresist layer 80 acts as an etch stop layer.

In order to define flow features in the thick film layer 80 such as a fluid chamber 82 and fluid supply channel 84, the layer 80 is masked with a mask 86 containing substantially transparent areas 88 and substantially opaque areas 90 thereon. Areas of the thick film layer 80 masked by the opaque areas 90 of the mask 86 will be removed upon developing to provide the flow features described above.

Figure 7:
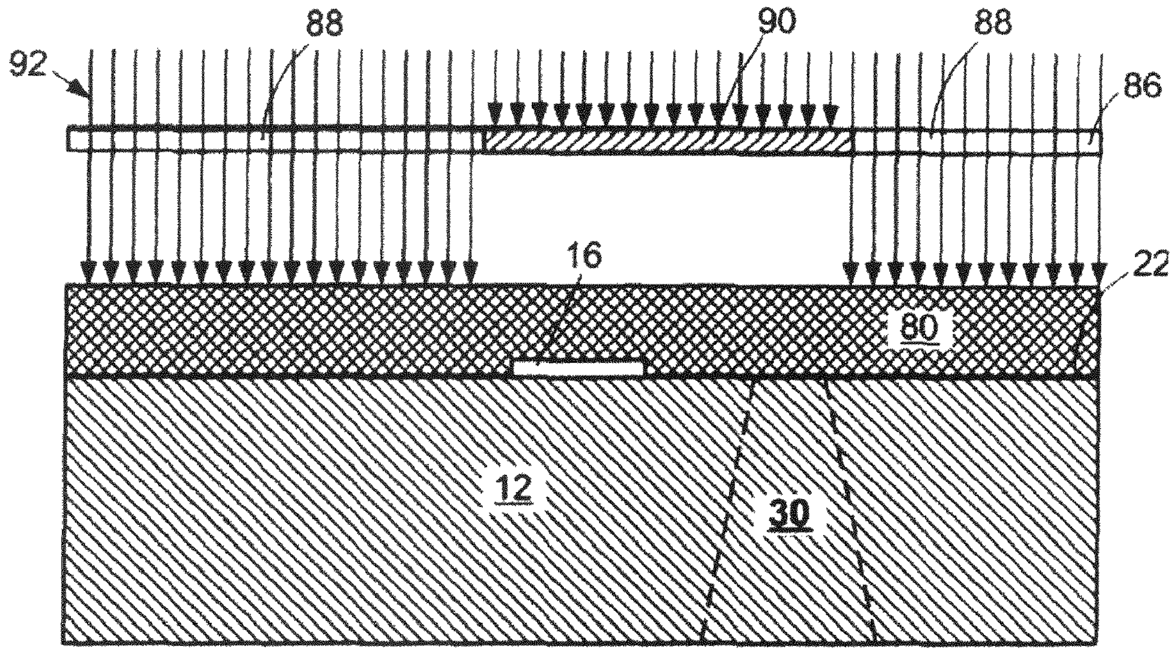
FIGS. 7-8 are schematic views of a process for imaging a thick film layer according to an embodiment of the disclosure.

In FIG. 7, a radiation source provides actinic radiation indicated by arrows 92 to image the thick film layer 80. A suitable source of radiation emits actinic radiation at a wavelength within the ultraviolet and visible spectral regions. Exposure of the thick film layer 80 may be from less than about 1 second to 10 minutes or more, such as from about 5 seconds to about one minute, depending upon the amounts of particular epoxy materials and aromatic complex salts being used in the formulation and depending upon the radiation source, distance from the radiation source, and the thickness of the thick film layer 80. The thick film layer 80 may optionally be exposed to electron beam irradiation instead of ultraviolet radiation.

The foregoing procedure is similar to a standard semiconductor lithographic process. The mask 86 is a clear, flat substrate usually glass or quartz with opaque areas 90 defining the areas to be removed from the layer 80 (i.e. a negative acting photoresist layer 80). The opaque areas 90 prevent the ultraviolet light from cross-linking the layer 80 masked beneath it. The exposed areas of the layer 80 provided by the substantially transparent areas 88 of the mask 86 are subsequently baked at a temperature of about 90° C. for about 30 seconds to about 10 minutes, such as from about 1 to about 5 minutes to complete the curing of the thick film layer 80.

Figure 8:
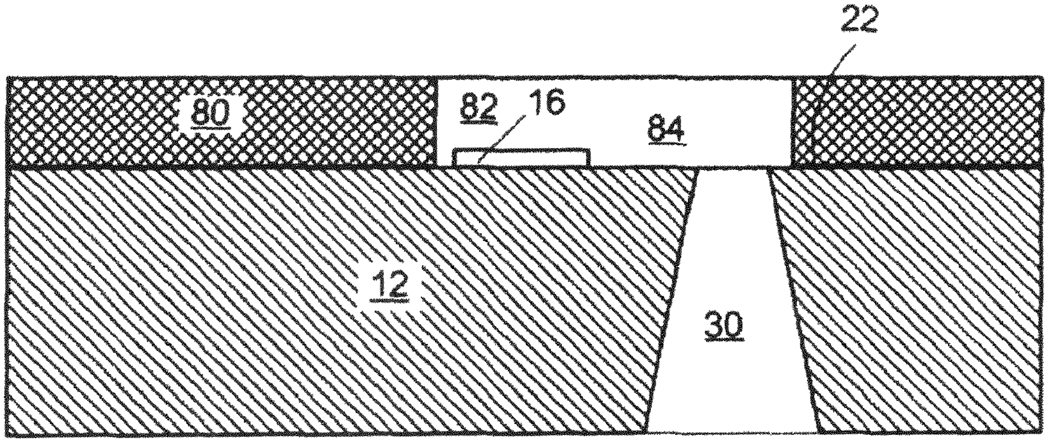
Figure 9:
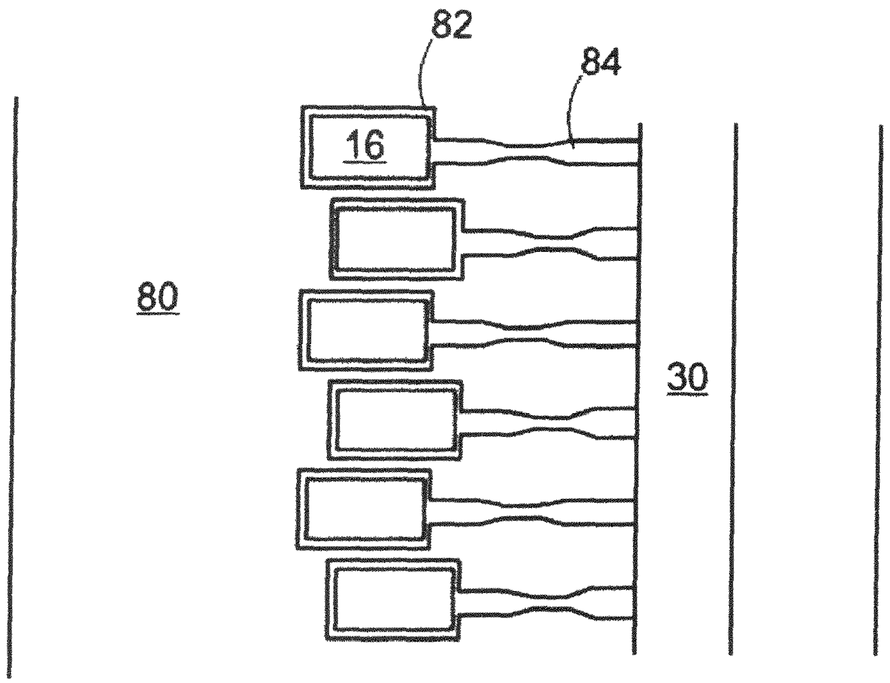
FIG. 9 is a partial plan view of a thick film layer after imaging on a substrate.

The non-imaged areas of the thick film layer 80 are then solubilized by a developer and the solubilized material is removed leaving the imaged and developed thick film layer 80 adjacent the device surface 22 of the substrate 12 as shown in FIG. 8 and in plan view in FIG. 9. The developer comes in contact with the substrate 12 and thick film layer 80 through either immersion and agitation in a tank-like setup or by spraying the developer on the substrate 12 and thick film layer 80. Either spray or immersion will adequately remove the non-imaged material. Illustrative developers include, for example, butyl cellosolve acetate, a xylene and butyl cellosolve acetate mixture, and $C_{1-6}$ acetates like butyl acetate. After developing the layer 80, the substrate 12 having the layer 80 is optionally baked at a temperature ranging from about 150° C. to about 200° C., such as from about from about 170° C. to about 190° C. for about 1 minute to about 60 minutes, such as from about 15 to about 30 minutes.

Referring again to FIGS. 5 and 6, a formulation, generally in accordance with the first embodiment, was used to make thick film layer 66. The formulation used was as follows:

TABLE 1

| Component | Amount in cured thick film layer (wt. %) |
|---|---|
| Difunctional epoxy component (EPON 1007F) | 72.7 |
| 4-phenyl sulfide) phenyl diphenylsulfonium hexafluoroantimonate (CYRACURE 6974) | 25.7 |
| Glycidoxypropyltrimethoxysilane (Z-6040) | 1.6 |

For comparison purposes, a formulation, generally in accordance with the second embodiment, was used to make the thick film layer 72 (FIG. 6) and includes:

TABLE 2

| Component | Amount in cured thick film layer (wt. %) |
|---|---|
| Difunctional epoxy component (EPON 1007F) | 40.5 |
| Multifunctional epoxy component (EPON SU-8) | 40.5 |
| Diaryliodoniumhexafluoroantimonate (PC-2506) | 17.8 |
| Glycidoxypropyltrimethoxysilane (SILQUEST A-187 from GE) | 1.2 |

Figure 6:
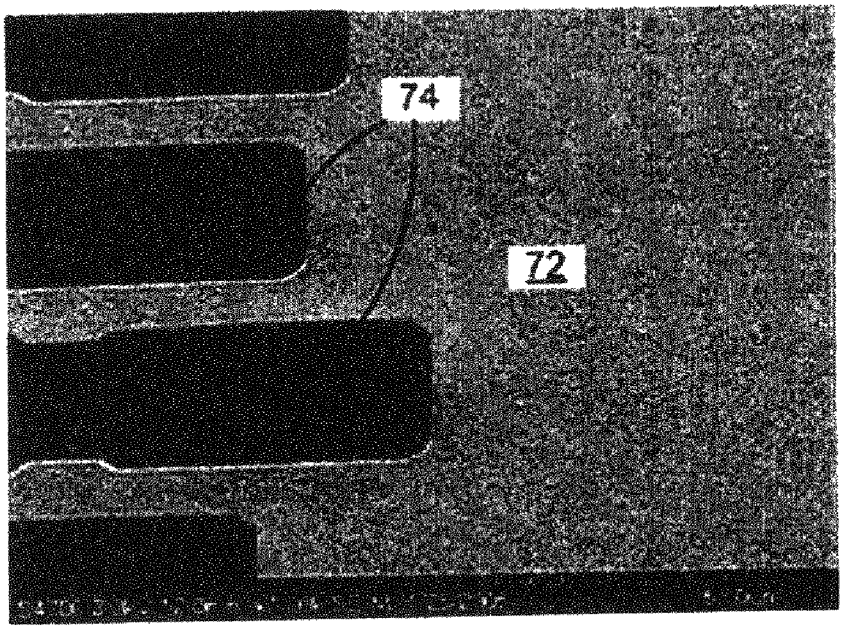
FIG. 6 is a photomicrograph of a thick film layer made with a formulation according to another embodiment after imaging and developing.

While the formulation of Table 1 may provide thick film layers 66 with suitable dimensional stability, the planarity of the thick film layer 66 may be significantly improved by use of the formulation in Table 2 as illustrated by the thick film layer 72 in FIG. 6. In addition, the thick film layer 72 made with the formulation of Table 2 provided substantially improved image resolution. For example, such a thick film layer 72 had a resolution of greater than about 10 microns (e.g., 6 microns at 13 to 20 microns thickness), with an aspect ratio of less than about 2:1 (e.g., about 5:1). The increased resolution of the thick film layer 72 as compared to thick film layer 66 is believed to be the result of incorporating the multifunctional epoxy component (EPON SU-8) into the formulation. Compared to the EPON 1007F component, the EPON SU-8 component allows an increase in functionality by 2 per repeat units, which enables an increase in cross link density and a reduction in swelling during development.

Another aid in improving image resolution of the thick film layer 72 is believed to be the use of the Polyset photoacid generator instead of the CYRACURE component. The Polyset photoacid generator has shown improvements in the rates of reaction and a larger energy window. The increase in the rate of reaction allows the progression of the cationic cure to propagate through the thickness of the thick film layer 72 at a faster rate insuring uniform distribution of cure as a function of depth.

Though epoxy materials provide outstanding strength, chemical resistance, and high temperature durability, epoxies undergo shrinkage during the curing and cooling process which may result in internal stresses within the thick film layer 66 that may provide the imperfections 70 shown in FIG. 5. The stresses may manifest themselves in the form of interfacial delamination or stress cracks through the thick film layer 66. Such stress cracks may cause the surface of the thick film layer 66 to be non-planar which may lead to non uniform etching (pitting and over etching) of the substrate 12 when forming the fluid supply slot 30 by a deep reactive ion etching process.

A technique to remove such stresses in the thick film layer 66 is the incorporation of a rubbery, flexible second phase within the epoxy. This rubbery phase forms soft, stress-relieving domains within the epoxy that will relieve some of the internal stresses and prevent the propagation of cracks. Most rubber phase materials are provided by nitrite groups. The nitrite groups on the rubber backbone enhance the interaction with the epoxy. However, the nitrile groups reduce the chemical resistance and decrease the cure rate of the thick film layer 66.

Another problem that may be evident with formulations for thick film layers is the "edge crispness" after development. After standard imaging and developing of the thick film layer, the flow features may show distortions and surface planarity irregularities 62, as illustrated in FIG. 2. Such surface irregularities may lead to significant problems during lamination of a dry film nozzle plate to a thick film layer. In order for the dry film lamination process to work effectively, a thick film layer should be substantially planar after imaging and development. The formulation of Table 2 more readily satisfies the planar requirements of the thick film layer.

Another formulation which may be used to provide improved thick film layers is illustrated in Table 3 and generally corresponds to the formulation of the first embodiment of the disclosure.

TABLE 3

| Component | Amount in cured thick film layer (wt. %) |
|---|---|
| Difunctional epoxy component (EPON 1007F) | 44.3 |
| 4-phenyl sulfide) phenyl diphenylsulfonium hexafluoroantimonate (CYRACURE 6974) | 0.9 |
| Glycidoxypropyltrimethoxysilane (Z-6040) | 2.4 |
| Acetophenone | 52.4 |

Thick film layers made with formulations according to Table 3 are expected to exhibit increased dimensional stability over prior art formulations with respect to thermal bonding of components to the thick film layer. Such formulations may be used where higher image resolutions requirements are absent.

Figure 10:
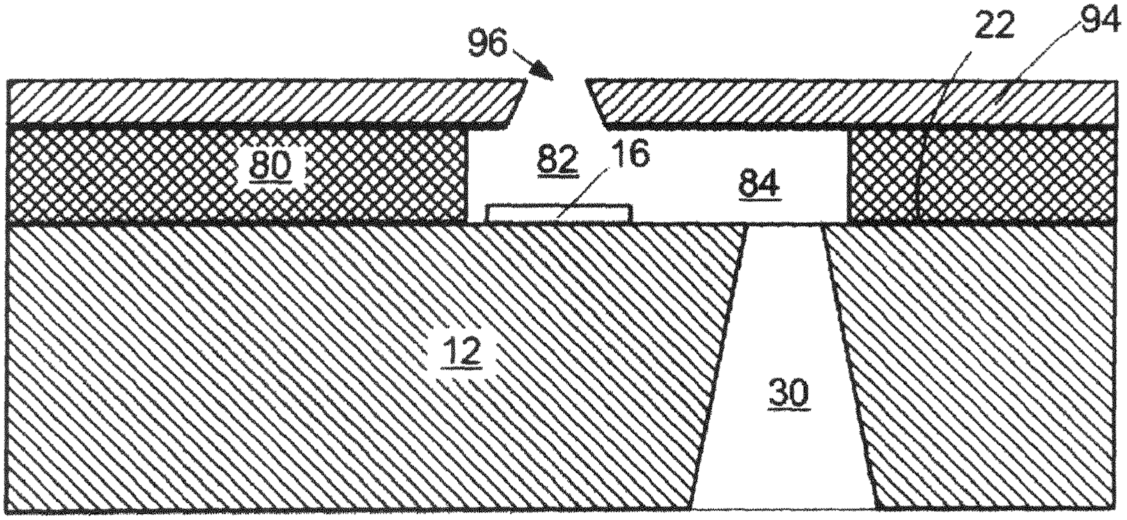
FIG. 10 cross-sectional view, not to scale, of a portion of a micro-fluid ejection head according to the disclosure containing a nozzle member laminated to a thick film layer.

With reference now to FIG. 10, subsequent to imaging and developing the thick film layer 80, a nozzle member, such as plate 94, is laminated adjacent (e.g., to) the thick film layer 80. The nozzle plate 94 is substantially rectangular and is aligned with the substrate 12 and thick film layer 80 so that the nozzles 96 are in axial alignment with corresponding fluid ejector actuators 16 on the device surface 22 of the substrate 12 and with the fluid chambers 82 in the thick film layer 80. In the case of a polyimide nozzle plate 94, the nozzle plate 94 may be adhesively attached to the thick film layer 80. In the case of a photoresist nozzle plate 94, the nozzle plate 94 may be laminated to the thick film layer 80 using pressure and heat.

Having described various aspects and exemplary embodiments and several advantages thereof, it will be recognized by those of ordinary skills that the disclosed embodiments is susceptible to various modifications, substitutions and revisions within the spirit and scope of the appended claims.

What is claimed is:

1. A method for increasing the planarity of a surface of a thick film layer after photoimaging and developing flow features therein for a micro-fluid ejection head, the method comprising:

applying a negative photoresist layer to a device surface of a substrate, wherein the negative photoresist layer is derived from a multi-functional epoxy compound, a difunctional epoxy compound, a photoacid generator devoid of aryl sulfonium salts, an adhesion enhancer, and an aryl ketone solvent;

heating the photoresist layer to remove at least a portion of the solvent;

cooling the photoresist layer;

etching a fluid feed slot through the substrate from a backside of the substrate opposite the device surface, wherein the heated and cooled photoresist layer serves as an etch stop to the etching; and thereafter imaging flow features in the photoresist layer; and developing the imaged photoresist layer to provide the plurality of flow features therein and the substantially planar thick film layer surface.

2. The method of claim 1, wherein the photoacid generator comprises a diaryliodonium hexafluoroantimonate.

3. The method of claim 1, wherein the negative photoresist layer includes substantially equal parts of the multi-functional epoxy compound and the difunctional epoxy compound.

4. The method of claim 1, wherein the photoresist layer is applied to the substrate by spin coating the photoresist layer onto the substrate.

5. The method of claim 1, wherein the adhesion enhancer comprises gamma-glycidoxypropyltrimethoxysilane.

* * * * *